(12) United States Patent
Hamamoto et al.

(10) Patent No.: US 8,598,282 B2
(45) Date of Patent: Dec. 3, 2013

(54) HIGH ADHESIVENESS SILICONE RESIN COMPOSITION AND AN OPTICAL SEMICONDUCTOR DEVICE PROVIDED WITH A CURED PRODUCT THEREOF

(75) Inventors: Yoshihira Hamamoto, Annaka (JP); Tsutomu Kashiwagi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 214 days.

(21) Appl. No.: 13/097,509

(22) Filed: Apr. 29, 2011

(65) Prior Publication Data

US 2011/0269918 A1 Nov. 3, 2011

(30) Foreign Application Priority Data

Apr. 30, 2010 (JP) ................. 2010-105633
Apr. 14, 2011 (JP) ................. 2011-090377

(51) Int. Cl.
C08G 77/16 (2006.01)
C08G 77/18 (2006.01)
C08F 283/12 (2006.01)

(52) U.S. Cl.
USPC ........................................ 525/478

(58) Field of Classification Search
USPC ............. 525/478; 524/588; 257/E33.066, 99
See application file for complete search history.

(56) References Cited

U.S. PATENT DOCUMENTS

| 7,323,250 | B2 | 1/2008 | Tabei et al. |
| 7,588,967 | B2 * | 9/2009 | Kashiwagi .................... 438/127 |
| 2010/0276721 | A1 | 11/2010 | Yoshitake et al. |

FOREIGN PATENT DOCUMENTS

| JP | 2005-272697 A | 10/2005 |
| JP | 2009-527622 A | 7/2009 |
| WO | WO 2007100445 A2 * | 9/2007 |

* cited by examiner

Primary Examiner — Randy Gulakowski
Assistant Examiner — Christopher M Rodd
(74) Attorney, Agent, or Firm — Birch, Stewart, Kolasch & Birch, LLP

(57) ABSTRACT

The object of the present invention is to provide a silicone resin composition for encapsulating an optical semiconductor element which has strong adhesiveness to a substrate and provide an optical semiconductor element which has high reliability. The present invention provides a silicone resin composition comprising an organopolysiloxane (A) having at least two alkenyl groups per molecule, a liner organohydrogenpolysiloxane (B-1) which has hydrogen atoms each bonded to a silicon atom at the both terminals and a liner organohydrogenpolysiloxane (B-2) which has a hydrogen atom bonded to a silicon atom at one terminal and a hydroxyl or alkoxy group bonded to a silicon atom at the other terminal, a branched organohydrogenpolysiloxane (C) having at least three hydrosilyl groups per molecule, a catalytic (D), and a condensation catalyst (E). The present invention also provides an optical semiconductor device provided with a cured product thereof.

10 Claims, 1 Drawing Sheet

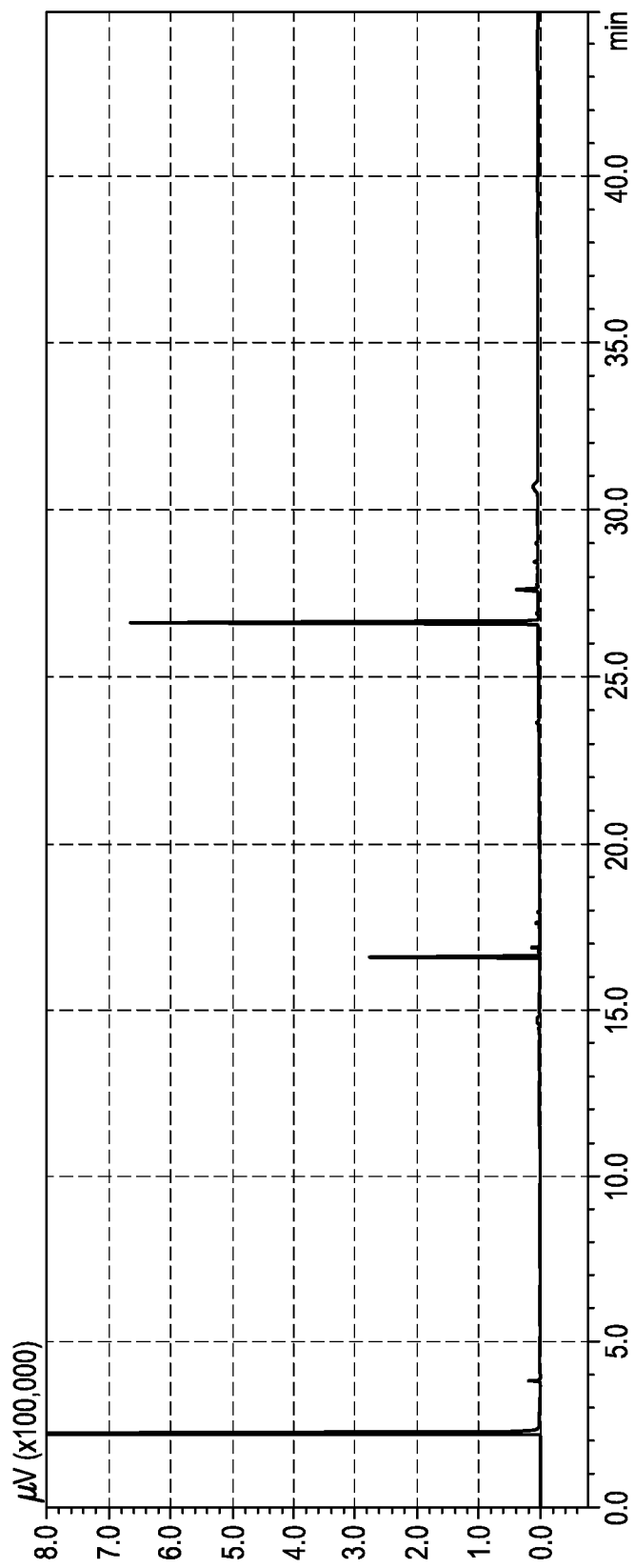

HIGH ADHESIVENESS SILICONE RESIN COMPOSITION AND AN OPTICAL SEMICONDUCTOR DEVICE PROVIDED WITH A CURED PRODUCT THEREOF

CROSS REFERENCE

This application claims the benefits of Japanese Patent Application No. 2010-105633 filed on Apr. 30, 2010 and Japanese Patent Application No. 2011-90377 filed on Apr. 14, 2011, the contents of which are herein incorporated by reference.

FIELD OF THE INVENTION

The present invention relates to a silicone resin composition which is useful as an encapsulating material for optical semiconductor elements.

BACKGROUND OF THE INVENTION

In recent years, high brightness LEDs which generate a strong light and a large amount of heat have been commercialized and widely used for general purpose illumination. Japanese Patent Application Laid-Open No. 2005-272697 discloses that a hinderdamine light stabilizer is added to a phenyl silicone resin to provide an encapsulating material having good heat resistance, stability in light resistance and weather resistance. The silicone resin composition has good light resistance, heat discoloration resistance and impact resistance, but the effect of the light stabilizer decreases in a long period of use, the phenyl group is decomposed to cause discoloration of the resin, and the siloxane bond is broken to degrade the resin.

Japanese National Phase Publication No. 2009-527622 discloses a silicone resin composition comprising a phenyl group-containing organopolysiloxane and a hydrogendiorganosiloxy-terminated oligodiphenylsiloxane. However, when the silicone resin composition is used in a high brightness LED package which generates a strong light and a large amount of heat, cracks occur at the edge of an LED package or the base of a lead frame. Particularly, its adhesiveness to silver is worse to cause peeling at the interface between an LED package and a silver frame.

PRIOR LITERATURES

Patent Literature

[Patent Literature 1] Japanese Patent Application Laid-Open No. 2005-272697
[Patent Literature 2] Japanese National Phase Publication No. 2009-527622

DISCLOSURE OF THE INVENTION

Problems to be Solved by the Invention

The object of the present invention is to provide a silicone resin composition for encapsulating an optical semiconductor element, which has strong adhesiveness to a substrate, and to provide an optical semiconductor device which has high reliability.

Means to Solve the Problems

To solve the aforesaid problems, the present inventors have made research and found that good adhesiveness to a substrate is attained by a cured product of an addition reaction curable silicone resin composition which comprises a linear organohydrogenpolysiloxane having a hydroxyl group or an alkoxy group at the terminal and a condensation catalyst, that the silicone resin composition has good light resistance and heat resistance, and, thereby, the cured product does not cause cracks nor peeling under strong light or high heat conditions and, further that the silicone resin composition has lower gas permeability and, thereby, the composition can prevent discoloration of the cured product.

Thus, the present invention provides a silicone resin composition comprising
(A) 49 to 95 parts by mass of an organopolysiloxane having at least two alkenyl groups per molecule,
(B) total 0.001 to 50 parts by mass of the following linear organohydrogenpolysiloxanes (B-1) and (B-2);
(B-1) a linear organohydrogenpolysiloxane which has hydrogen atoms each bonded to a silicon atom at the both terminals, and
(B-2) a linear organohydrogenpolysiloxane which has a hydrogen atom bonded to a silicon atom at one terminal and a hydroxyl or alkoxy group bonded to a silicon atom at the other terminal,
provided that a mass ratio of the components (B-1) to (B-2) is (90 to 99.9):(10 to 0.1),
(C) 0.01 to 20 parts by mass of a branched organohydrogenpolysiloxane having at least three hydrosilyl groups per molecule,
provided that a total amount of components (A), (B) and (C) is 100 parts by mass,
(D) a catalytic amount of an addition reaction catalyst, and
(E) 0.001 to 1 part by mass of a condensation catalyst, relative to a total 100 parts by mass of components (A), (B) and (C).

The present invention also provides an optical semiconductor device provided with a cured product thereof.

Effects of the Invention

The present silicone resin composition can provide a cured product which has good adhesiveness to a substrate. Further, the present silicone resin composition is used to encapsulate an optical semiconductor element such as a high brightness LED to provide an optical semiconductor device which has high heat resistance, light resistance, discoloration resistance, impact resistance and reliability. Therefore, the present silicone resin composition can be advantageously used as an encapsulating material for optical semiconductor devices.

BRIEF DESCRIPTION ON A DRAWING

FIG. 1 is a chart of gas chromatography (GC) of an organohydrogenpolysiloxane prepared in Synthesis Example 4.

BEST MODE OF THE INVENTION (A) Organopolysiloxane
The component (A) is an organopolysiloxane having at least two alkenyl groups per molecule, and is represented by the following average compositional formula (1):

$$R^1_a R^2_b R^3_c SiO_{(4-a-b-c)/2} \quad (1)$$

wherein $R^1$ is, independently of each other, a substituted or unsubstituted monovalent hydrocarbon group which does not have an alkenyl group and is not an aryl group, $R^2$ is an aryl group, $R^3$ is an alkenyl group, a is the number of 0.4 to 1.0, b is the number of 0 to 0.5, and c is the number of 0.05 to 0.5, provided that a+b+c is 1.0 to 2.0.

In the afore-mentioned formula (1), $R^1$ is a monovalent hydrocarbon group preferably having 1 to 10, more preferably 1 to 6, carbon atoms. Examples of the $R^1$ include alkyl groups such as methyl, ethyl, propyl, isopropyl, butyl, isobutyl, tert-butyl, pentyl, neopentyl, hexyl, octyl, nonyl and decyl groups; aralkyl groups such as benzyl, phenylethyl and phenylpropyl groups; and those groups where apart or the whole of their hydrogen atoms are replaced with a halogen atom(s), such as fluorine, bromine and chlorine atoms, or a cyano group, such as halogen-substituted alkyl groups, for instance, chloromethyl, chloropropyl, bromoethyl and trifluoropropyl groups, and a cyanoethyl group.

In the afore-mentioned formula (1), $R^2$ is an aryl group, preferably having 6 to 10 carbon atoms. Examples of the $R^2$ include phenyl, tolyl, xylyl and naphthyl groups.

In the afore-mentioned formula (1), $R^3$ is an alkenyl group, preferably having 2 to 8, more preferably 2 to 6, carbon atoms. Examples of the $R^3$ include vinyl, allyl, propenyl, isopropenyl, butenyl, hexenyl, cyclohexenyl and octenyl groups. Among these, preferred are vinyl and allyl groups.

The organopolysiloxane comprises a linear organopolysiloxane is composed of repeating diorganosiloxane units represented by $R_2SiO_{2/2}$ whose main chain and which has triorganosiloxy groups represented by $R_3SiO_{1/2}$ at the both terminals, wherein R is as defined for $R^1$, $R^2$ and $R^3$ mentioned above. In particular, a linear organopolysiloxane which is represented by the following formula (4) having one or more vinyl groups at the both terminals and has a viscosity at 25 degrees C. of 10 to 1,000,000 mPa·s, preferably 1,000 to 50,000 mPa·s, is preferred for workability and curability. The viscosity is determined with a rotational viscometer. The linear organopolysiloxane may comprise a small amount of branched structure in its molecular chain.

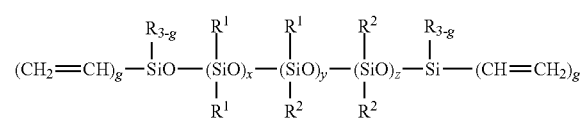

(4)

wherein, $R^1$ and $R^2$ are as defined above, R is as defined for $R^1$ and $R^2$, and g is an integer of 1, 2 or 3.

In the afore-mentioned formula (4), x, y and z are zero or a positive integer which satisfy the equation $1 \le (x+y+z) \le 1,000$, preferably $5 \le (x+y+z) \le 500$, more preferably $30 \le (x+y+z) \le 500$, provided that $0.5 < (x+y)/(x+y+z) \le 1.0$.

Examples of the organopolysiloxanes represented by the afore-mentioned formula (4) include the following.

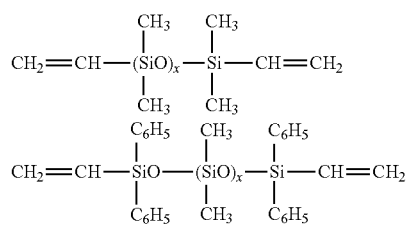

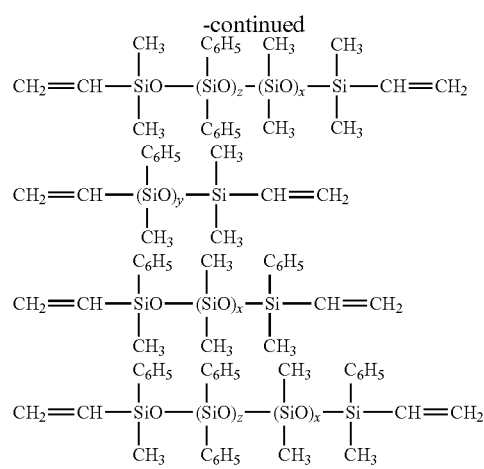

wherein, x, y and z are as defined above.

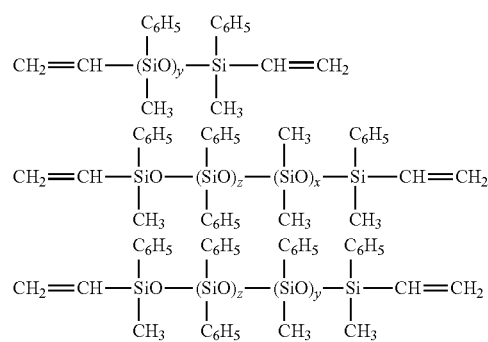

wherein, x, y and z are as defined above.

A part of component (A) may be an organopolysiloxane having a resin structure, namely, three dimensional network structure. The organopolysiloxane having a resin structure preferably comprises an $R^6SiO_{1.5}$ unit, an $R^5_kR^6_pSiO$ unit and an $R^5_qR^6_rSiO_{0.5}$ unit, wherein $R^5$ is a vinyl or allyl group, and $R^6$ is as defined for $R^1$ and $R^2$ mentioned above, preferably a phenyl group. k is 0 or 1, and p is 1 or 2, provided that a total of k and p is 2. q is 1, 2 or 3, and r is 0, 1 or 2, provided that a total of q and r is 3.

Where the $R^6SiO_{1.5}$ unit is abbreviated as "a"; the $R^5_kR^6_pSiO$ unit, "b"; and the $R^5_qR^6_rSiO_{0.5}$ unit, "c", a molar ratio, (b+c)/a, is preferably 0.01 to 1, more preferably 0.1 to 0.5; and a molar ratio, c/a, is preferably 0.05 to 3, more preferably 0.1 to 0.5. A weight average molecular weight of the organopolysiloxane by GPC, reduced to polystyrene, is preferably in the range of 500 to 10,000.

The organopolysiloxane having a resin structure may further comprise small amounts of bifunctional siloxane unit and trifunctional siloxane unit in addition to the aforesaid a, b, and c units, as long as the purposes of the present invention are not obstructed.

The organopolysiloxane having a resin structure can be easily prepared by combining source compounds for a, b, and c units so that the afore-mentioned molar ratios are met and, for instance, carrying out co-hydrolysis in the presence of an acid.

As the source compound for a, use may be made of phenyltrichlorosilane, phenyltrimethoxysilane, phenyltriethoxysilane, cyclohexyltrichlorosilane, cyclohexyltrimethoxysilane, cyclohexyltriethoxysilane, cyclopentyltrichlorosilane, n-propyltrichlorosilane, methyltrichlorosilane, methyltrimethoxysilane and methyltriethoxysilane.

As the source compound for b, the following compounds can be used:

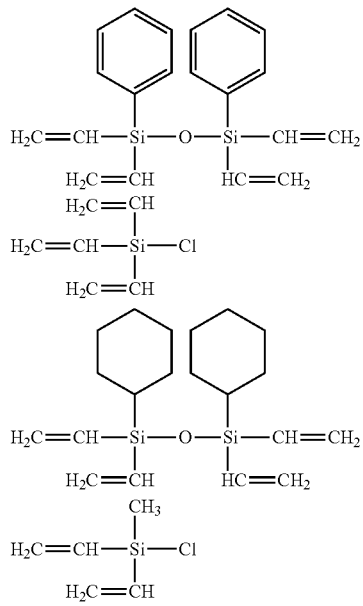

As the source compound for c, the following compounds can be used:

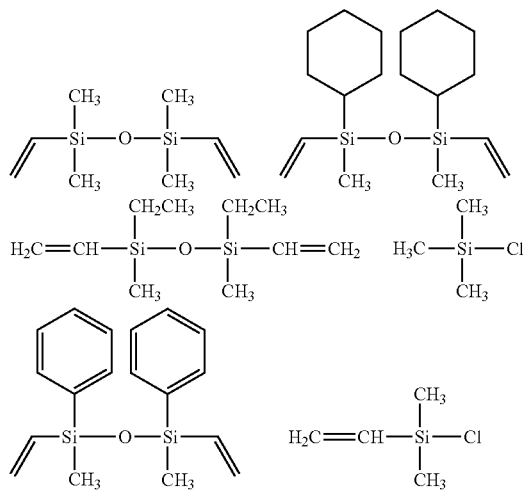

The organopolysiloxane having a resin structure is used to improve physical strength and tackiness of a surface of a cured product. This organopolysiloxane is preferably contained in an amount of 20 to 95% by mass, more preferably 40 to 90% by mass, in the component (A). If the amount of the organopolysiloxane having a resin structure is too small, the afore-mentioned effect may, sometime, not be attained sufficiently. If the amount is too large, a viscosity of the composition is so high that cracks may occur in a cure product. The amount of component (A) ranges from 49 to 95 parts by mass, relative to the total 100 parts by mass of the components (A), (B) and (C).

(B) Linear Organohydrogenpolysiloxane

The linear organohydrogenpolysiloxane functions as a cross-linking agent. One of the characteristics of the present invention is that the present composition comprises a linear organohydrogenpolysiloxane (B-1) which has hydrogen atoms each bonded to a silicon atom at the both terminals, and another linear organohydrogenpolysiloxane (B-2) which has a hydrogen atom bonded to a silicon atom at one terminal and a hydroxyl or alkoxy group bonded to a silicon atom at the other terminal. The hydrosilyl groups in the components (B-1) and (B-2) addition react with the alkenyl group in the component (A) to form a cross-linked structure. The component (B-2) has a hydroxyl group or an alkoxy group to cause an intermolecular hydrolysis condensation reaction and a condensation reaction with a hydroxyl group which is present on a surface of a substrate. The present silicone resin composition causes the addition reaction and the condensation reaction at the same time to provide a cured product which has high adhesiveness to a substrate.

The linear organohydrogenpolysiloxane (B-1) is represented by the following formula (2).

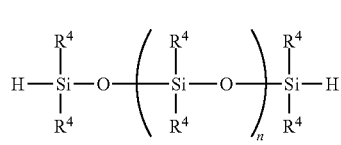

(2)

In the formula, $R^4$ is, independently of each other, a substituted or unsubstituted, monovalent hydrocarbon atoms having no alkenyl group. n is an integer of from 0 to 10, preferably an integer of from 1 to 4.

The linear organohydrogenpolysiloxane (B-2) is represented by the following formula (3).

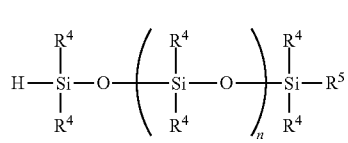

(3)

In the formula, $R^4$ is, independently of each other, a substituted or unsubstituted, monovalent hydrocarbon atoms having no alkenyl group, $R^5$ is a hydroxyl group or an alkoxy group, and the alkoxy group preferably has 1 to 8, more preferably 1 to 4, carbon atoms. n is an integer of from 0 to 10, preferably an integer of from 1 to 4. If an average of n in the component (B) is less than 1, such an organopolysiloxane tends to volatilize in curing by heating, so that curing is incomplete.

In the afore-mentioned formulas (2) and (3), $R^4$ is, independently of each other, a substituted or unsubstituted, monovalent hydrocarbon atoms having no alkenyl group, preferably having 1 to 10, more preferably 1 to 6, carbon atoms. Examples of $R^4$ include alkyl groups such as methyl, ethyl, propyl, isopropyl, butyl, isobutyl, tert-butyl, pentyl, neopentyl, hexyl, octyl, nonyl and decyl groups; aryl groups such as phenyl, tolyl, xylyl and naphthyl groups; aralkyl groups such as benzyl, phenylethyl and phenylpropyl groups; and those groups where a part or the whole of their hydrogen atoms each bonded to a carbon atom are replaced with a halogen atom(s), such as fluorine, bromine and chlorine atoms or a cyano group, such as halogen-substituted alkyl groups, for instance, chloromethyl, chloropropyl, bromoethyl and trifluoropropyl groups, and a cyanoethyl group. A methyl group and a phenyl group are preferred.

In particular, preferred is that the component (B-1) is an organohydrogenpolysiloxane represented by the following formula (4);

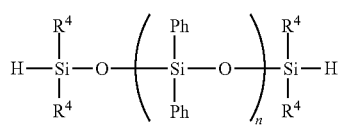

wherein $R^4$ and n are as defined above and Ph means a phenyl group, and the component (B-2) is an organohydrogenpolysiloxane represented by the following formula (5);

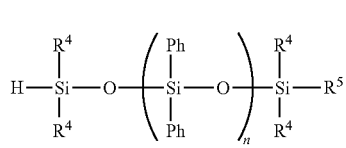

wherein $R^4$, $R^5$ and n are as defined above and Ph means a phenyl group.

The mass ratio of the components (B-1) to (B-2) is (90 to 99.9):(10 to 0.1), preferably (93 to 99.5):(7 to 0.5). If the mass ratio of the component (B-2) is too small, the adhesion of the cured product is less. If the mass ratio of the component (B-2) is too large, the silanol group remains in a cured product to cause the siloxane bond to break under strong heat, strong light and a large amount of water, whereby, the function as an adhesive aid is not sufficiently attained, and, further, crack occur, peeling occurs at the interface between a package and a silver frame, and reliability of an optical semiconductor device is decreased.

This organohydrogenpolysiloxane can be prepared by a known method, such as aid equilibrating a siloxane having an SiH group and dialkoxysilane in the presence of a strong acid catalyst. The present composition may contain a small amount of an organohydrogenpolysiloxane which has a hydroxyl or alkoxy group bonded to a silicon atom at the both terminals.

A total mass of the components (B-1) and (B-2) ranges from 0.001 to 50 parts by mass, preferably 5 to 40 parts by mass, relative to the total 100 parts by mass of components (A), (B) and (C).

(C) Branched Organohydrogenpolysiloxane

The component (C) is a branched organohydrogenpolysiloxane having at least three, preferably at least four, hydrosilyl groups per molecule. The hydrosilyl group in the component (C) addition reacts with the alkenyl group in the component (A) to form a cross-linked structure. The branched organohydrogenpolysiloxane is represented by the following average compositional formula (6):

wherein $R^7$ is, independently of each other, a substituted or unsubstituted, monovalent hydrocarbon atoms which does not have an alkenyl group and is not an aryl group, $R^2$ is an aryl group, a is the number of 0.6 to 1.5, b is the number of 0 to 0.5, and d is the number of 0.4 to 1.0, provided that a+b+d is 1.0 to 2.5.

In the afore-mentioned formula (3), $R^7$ is a monovalent hydrocarbon group preferably having 1 to 10, more preferably 1 to 7, carbon atoms. Examples of the $R^7$ include alkyl groups such as methyl, ethyl, propyl, isopropyl, butyl, isobutyl, tert-butyl, pentyl, neopentyl, hexyl, octyl, nonyl and decyl groups; halogen-substituted alkyl groups such as chloromethyl, chloropropyl, bromoethyl and trifluoropropyl groups and; a cyanoethyl group.

In the afore-mentioned formula (3), $R^2$ is an aryl group, preferably, having 6 to 10 carbon atoms. Examples of $R^2$ include phenyl, tolyl, xylyl and naphthyl groups. a is the number of 0.6 to 1.5, b is the number of 0 to 0.5, and d is the number of 0.4 to 1.0, provided that a+b+d is 1.0 to 2.5. The hydrosilyl group may be at the terminal or in a middle part of the molecular chain, and, thus, may be present anywhere.

Examples of the organohydrogenpolysiloxane include tris (dimethylhydrogensiloxy)methylsilane, tris(dimethylhydrogensiloxy)phenylsilane, 1,1,3,3-tetramethyldisiloxane, 1,3,5,7-tetramethylcyclotetrasiloxane, methylhydrogenpolysiloxane with both ends blocked with trimethylsiloxy groups, copolymers of dimethylsiloxane and methylhydrogensiloxane with both ends blocked with trimethylsiloxy groups, copolymers of dimethylsiloxane and methylhydrogensiloxane with both ends blocked with dimethylhydrogensiloxy groups, copolymers of methylhydrogensiloxane and diphenylsiloxane with both ends blocked with trimethylsiloxy groups, copolymers of methylhydrogensiloxane, diphenylsiloxane and dimethylsiloxane with both ends blocked with trimethylsiloxy groups, copolymers composed of $(CH_3)_2HSiO_{1/2}$ unit and $SiO_{4/2}$ unit, and copolymers composed of $(CH_3)_2HSiO_{1/2}$ unit, $SiO_{4/2}$ unit and $(C_6H_5)SiO_{3/2}$ unit.

The organohydrogensiloxanes having the following structure can also be used.

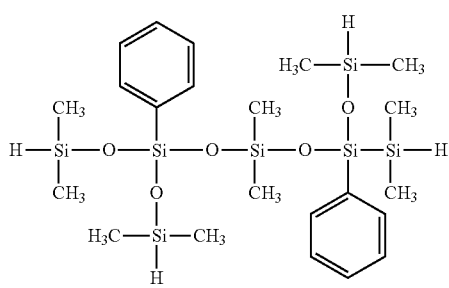

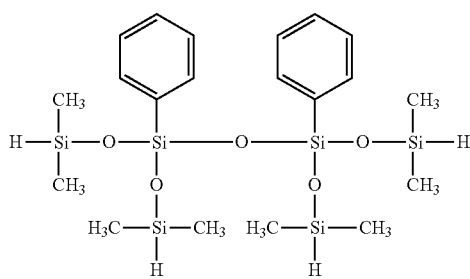

-continued

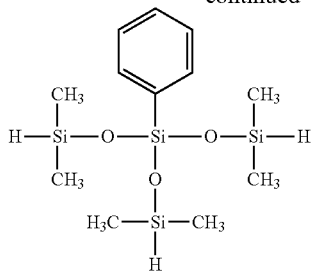

The molecular structure of the organohydrogenpolysiloxane (C) may be any of cyclic and three-dimensional network structures. The number of the silicon atoms in one molecule or the degree of polymerization is 3 to 100, preferably 3 to 10.

This organohydrogenpolysiloxane can be prepared according to a known method, for instance, by hydrolyzing chlorosilane represented by $RSiHCl_2$, $R_3SiCl$, $R_2SiCl_2$ or $R_2SiHCl$ wherein R is as defined for $R^7$ and $R^2$ as defined above, or by equilibrating the siloxanes resulting from the hydrolysis in the presence of a strong acid catalyst.

The amount of the component (C) ranges from 0.01 to 20 parts by mass, preferably 0.1 to 15 parts by mass, relative to the total 100 parts by mass of the components (A), (B) and (C). The amounts of organohydrogenpolysiloxans (B) and (C) are such as effective for curing the component (A), particularly such as the hydrosilyl group of 0.5 to 4.0 equivalents, preferably 0.8 to 2.0 equivalents, more preferably 0.9 to 1.5 equivalents, per equivalent of the alkenyl group in the component (A). If the amount is smaller than the afore-mentioned lower limit, the addition reaction does not proceed and a cured product may not be obtained. If the amount is larger than the afore-mentioned upper limit, a lot of unreacted hydrosilyl groups remain in a cured product to cause change in the rubber properties with time.

The present silicone resin composition preferably comprises an aryl group of 10 to 60 mass %, preferably 15 to 60 mass %, based on the total mass of components (A), (B) and (C). Examples of the aryl group include phenyl, tolyl, xylyl and naphthyl groups. Among these, a phenyl group is preferred. If the amount of the aryl group is smaller than the afore-mentioned lower limit, gas permeability of the cured product increases to cause erosion of a silver surface in an LED package and decrease the brightness of the LED. If the amount is larger than the afore-mentioned upper limit, the reliability of a semiconductor device is worse.

(D) Addition Reaction Catalyst

The component (D) is added to accelerate an addition reaction between the component (A) and the components (B) and (C). The catalyst may be a compound of platinum, palladium or rhodium, but those comprising a metal of the platinum group are preferred in costs. Examples include $H_2PtCl_6.mH_2O$, $K_2PtCl_6$, $KHPtCl_6.mH_2O$, $K_2PtCl_4$, $K_2PtCl_4.mH_2O$, and $PtO_2.mH_2O$, wherein m is a positive integer, and complexes thereof with a hydrocarbon such as an olefin, an alcohol or a vinyl group-containing organopolysiloxane. The afore-mentioned catalysts may be used alone or in a combination thereof.

The catalysts may be used in a so-called catalytic amount, preferably 0.0001 to 0.2 part by mass, more preferably 0.0001 to 0.05 part by mass, of a platinum group metal, relative to the total 100 parts by mass of components (A), (B) and (C).

(E) Condensation Catalyst

The condensation catalyst (E) is used to promote an intermolecular condensation reaction of the component (B) and a condensation reaction between the component (B) and a hydroxyl group which is present on a surface of a substrate. Examples of the condensation catalyst include tin (II) or tin (IV) compounds such as tindilaurate, di-n-butyltin dilaurate, tin bis(2-ethylhexanoate)dioctoate, bis(neodecanoate)tin, di-n-butyldiacetoxytin and tetrabutyltin; titanium compounds such as titanium tetraisopropoxide, titanium tetraoctoxide, titanium tetra-n-butoxide, dimer of titanium butoxide, titanium tetra-2-ethylhexoxide, titanium diisopropoxybis(acetylacetonate), titanium dioctyloxybis(octylene glycolate) and diisopropoxybis(ethylacetoacetate)titanium; aluminum compounds such as aluminum tris(acetylacetonate), aluminum tris(acetoacetate) and aluminum tris(sec-butoxide); nickel compounds such as nickel bis(acetylacetonate); cobalt compounds such as cobalt tris(acetylacetonate); zinc compounds such as zinc bis(acetylacetonate); zirconium compounds such as zirconium tetra-normal-propoxide, zirconium tetra-normal-butoxide, zirconium tetra(acetylacetonate), zirconium tributoxy-mono(acetylacetonate), zirconium monobutoxy-acetylacetonate, zirconium dibutoxy-bis(ethylacetoacetate), zirconium tetra(acetylacetonate) and zirconium tributoxymonostearate. The afore-mentioned catalysts may be used alone or in a combination thereof. In particular, preferred are Orgatics ZA series, ex Matsumoto Trading Co., Ltd., which are zirconium catalyst and has high discoloration resistance and good reactivity.

The amount of the component (E) ranges from 0.001 to 1 part by mass, preferably 0.001 to 0.1 part by mass, relative to the total amount of components (A), (B) and (C). If the amount is larger than the afore-mentioned upper limit, discoloration of a cured product occurs. If the amount is smaller than the afore-mentioned lower limit, the effect of promoting adhesion is less.

(F) Adhesion-Imparting Agent

The present silicone resin composition may further comprise an adhesion-imparting agent in addition to components (A) to (E). Examples of the adhesion-imparting agent include vinyltrimethoxysilane, vinyltriethoxysilane, 2-(3,4-epoxycyclohexyl)ethyltrimethoxysilane, 3-glysidoxypropyltrimethoxysilane, 3-glysidoxypropylmethyldiethoxysilane, 3-glysidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, N-2(aminoethyl)3-aminopropylmethyldimethoxysilane, N-2(aminoethyl)3-aminopropyltrimethoxysilane, N-2(aminoethyl)3-aminopropyltriethoxysilane, 3-aminopropyltrimethoxylsilane, 3-aminopropyltriethoxylsilane, N-phenyl-3-aminopropyltrimethoxylsilane and 3-mercaptopropyltrimethoxylsilane; and trimethoxysilane, tetramethoxysilane, phenyltrimethoxysilane, dipehyldimethoxysilane and an oligomer thereof. The afore-mentioned adhesion-imparting agent may be used alone or in a combination thereof. The amount of the adhesion-imparting agent ranges from 0.001 to 10 part by mass, preferably 0.001 to 5 parts by mass, relative to the total 100 parts by mass of the components (A), (B) and (C). In particular, preferred is the adhesion-imparting agent represented by the following formula.

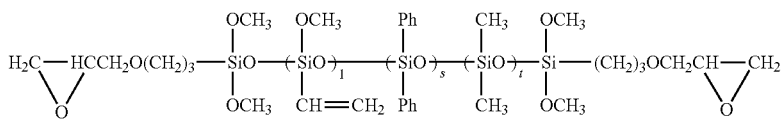

In the formula, s is an integer of from 1 to 50 and t is an integer of from 1 to 100.

(G) Inorganic Filler

The inorganic filler may be contained in the present composition to give a cured product impact resistance, effects of reinforcing, diffusing lights from an LED, preventing precipitation of a fluorescent material and reducing an expansion coefficient. Any inorganic filler having the afore-mentioned effects can be used. Examples of the inorganic filler include reinforcing inorganic fillers such as fumed silica and fumed titanium dioxide, and non-reinforcing inorganic fillers such as calcium carbonate, calcium silicate, titanium dioxide, iron (III) oxide, carbon black and zinc oxide. The amount of the inorganic filler ranges from 0.01 to 300 parts by mass, preferably 0.01 to 50 parts by mass, relative to the total 100 parts by mass of the components (A), (B) and (C).

The present silicone resin composition may further comprise conventional additives, if necessary, in addition to components (A) to (G). Examples of the additives include light degradation preventives such as hindered amine; and reactive diluents such as vinylethers, vinyl amides, epoxy resins, oxetanes, allyl phthalates and vinyl adipate. These additives may be properly added in such an amount that the purposes of the present invention are not obstructed. Further, the silicone resin composition comprising a phenyl group-containing silicone preferably comprises an antioxidant in properly amount, because heat resistance of the phenyl group-containing silicone is poor, compared to dimethylsilicone.

Examples of the antioxidant include pentaerythritol tetrakis[3-(3,5-di-tert-butyl-4-hydroxyphenyl)propionate], N,N'-propane-1,3-diylbis[3-(3,5-di-tert-butyl-4-hydroxyphenyl)propionamide], thiodiethylenebis[3-(3,5-di-tert-butyl-4-hydroxyphenyl)propionate], octadecyl-3-(3,5-di-tert-butyl-4-hydroxyphenyl)propionate, 6,6'-di-tert-butyl-2,2'-thiodi-p-cresol, N,N'-hexane-1,6-diylbis[3-(3,5-di-tert-butyl-4-hydroxyphenylpropionamide)], benzenepropanoic acid, 3,5-bis(1,1-dimethylethyl)-4-hydroxy, alkyl ester having C7-C9 side chain, diethyl[[3,5-bis(1,1-dimethylethyl)-4-hydroxyphenyl]methyl]phosphonate, 2,2'-ethylenebis[4,6-di-tert-butylphenol], 3,3',3'',5,5',5''-hexa-tert-butyl-a,a',a''-(mesitylene-2,4,6-triyl)tri-p-cresol, calciumdiethylbis[[[3,5-bis(1,1-dimethylethyl)-4-hydroxyphenyl]methyl]phosphonate], 4,6-bis(octylthiomethyl)-o-cresol, 4,6-bis(dodecylthiomethyl)-o-cresol, ethylenebis(oxyethylene)bis[3-(5-tert-butyl-4-hydroxy-m-tolyl)propionate], hexamethylenebis[3-(3,5-di-tert-butyl-4-hydroxyphenyl)propionate], 1,3,5-tris(3,5-di-tert-butyl-4-hydroxybenzyl)-1,3,5-triazine-2,4,6-trione, 1,3,5-tris[(4-tert-butyl-3-hydroxy-2,6-xylyl)methyl]-1,3,5-triazine-2,4,6-(1H,3H,5H)-trione, 6,6'-di-tert-butyl-4,4'-tiodi-m-cresol, diphenylamine, reaction product of N-phenylbenzenamine and 2,4,4'-trimethylpentene, 2,6-di-tert-butyl-4-(4,6-bis(octylthio)-1,3,5-triazin-2-ylamino)phenol, 3,4-dihydro-2,5,7,8-tetramethyl-2-(4,8,12-trimethyltridecyl)-2H-1-benzopyran-6-ol, 2',3-bis[[3-[3,5-di-tert-butyl-4-hydroxyphenyl]propionyl]]propionohydrazide, didodecyl 3,3'-thiodipropionate and dioctadecyl 3,3'-thiodipropionate. Preferred are Irganox 245, 259, 295, 565, 1010, 1035, 1076, 1098, 1135, 1130, 1425WL, 1520L, 1726, 3114 and 5057, ex Chiba Japan Co., Ltd. These antioxidants may be used also in combination of two or more thereof.

The present silicone resin composition can be prepared by stirring, melting, mixing and dispersing the aforesaid components altogether or sequentially, if necessary, under heating. The component (A) and the components (B) and (C) are stored preferably in two separate solutions to avoid the curing reaction before use, and mixed at the time of use to cause curing. Particularly, if the components (A) and (C) are stored together in one solution, a dehydrogen reaction may occur. Therefore, it is preferred to store the component (A) and component (C) separately. Alternatively, a small amount of a cure inhibitor such as acetylenealcohol may be added to a solution of the components (A), (B) and (C) to store.

Any apparatus can be used for the stirring and so on, such as a grinding machine equipped with a stirrer and a heater, a three-roll mill, a ball mill, and a planetary mixer. These apparatuses may be used in combination, if necessary. The viscosity of the present silicone resin composition, as determined at 25 degrees C. with a rotational viscometer, ranges from 100 to 10,000,000 mPa·s, preferably 300 to 500,000 mPa·s.

The curing of the present composition is not limited to any particular one, and is usually conducted at 40 to 250 degrees C., preferably 60 to 200 degrees C., for 5 minutes to 10 hours, preferably 30 minutes to 6 hours. The cured product of the present silicone resin composition has high transparency and good adhesion to package materials such as LCP, and to metal substrates. Therefore, the present silicone resin composition is suitable as an encapsulating material for optical semiconductor elements such as LEDs, photodiodes, CCDs, CMOSes and photo couplers. In particular, the present silicone resin composition is advantageously used as an encapsulating material for high brightness LEDs.

When a silver plated lead frame is encapsulated with the cured product obtained from the present silicone resin composition, it is preferred that the surface of the silver plated lead frame is treated in advance to increase the wettability with the silicone resin composition. The surface treatment is conducted preferably in a dry method such as ultraviolet treatment, ozone treatment and plasma treatment for workability and maintenance of the equipment, and plasma treatment is particularly preferred. The material of the pre-molded package preferably contains a silicone component of 15 mass % or more per total mass of the organic components to increase compatibility with the silicone resin composition. The aforesaid silicone component is defined as a chemical compound having Si units and a polymer thereof. If the amount of the silicone component is less than 15%. by mass, the compatibility with the silicone resin composition is low, whereby, voids occur between the silicone resin composition and the pre-molded package during encapsulation, so that an optical semiconductor device obtained tends to cause cracks.

The present silicone resin composition cures in an addition reaction and a condensation reaction to provide a cured product having high adhesion to a substrate. The cured product does not have an unreacted hydroxyl group nor unreacted alkoxy group therein. Therefore, the gas permeability is low, whereby, the optical semiconductor device encapsulated with the cured product has good discoloration resistance and durable reflection efficiency.

Further, the cured product obtained by curing the present silicone resin composition has good light resistance and heat resistance. Therefore, the present composition can provide optical semiconductor devices having high heat resistance, light resistance, discoloration resistance, impact resistance and reliability.

EXAMPLES

The present invention will be explained below in further detail with reference to a series of the Examples and Comparative Examples, though the present invention is in no way limited by these Examples. In the following description, the term "part" refers to "part by mass".

Preparation of an Organopolysiloxane Having Resin Structure

Synthesis Example 1

In a flask, placed were 1050 g of xylene and 5143 g of water. To the resulting mixture, was dropwise added a mixture of 2222 g of phenyl trichlorosilane (10.5 mols), 543 g of vinyl dimethyl chlorosilane (4.50 mols) and 1575 g of xylene, which was stirred further for 3 hours. The formed acid was separated, and the resulting mixture was washed with water. The remaining mixture was subjected to azeotropic dehydration. Then, 6 g of KOH (0.15 mols) was added to the resulting mixture and heated at 150 degrees C. to reflux through the night. Then, the reaction mixture was neutralized with 27 g of trimethylchlorosilane (0.25 mols) and 24.5 g of potassium acetate (0.25 mols), filtered and, subsequently, subjected to stripping under reduced pressure to remove the solvent to obtain the siloxane resin (Resin 1) represented by the following average formula. The equivalent of a vinyl group is 0.195 mol/100 g.

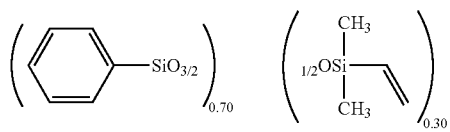

Synthesis Example 2

In a flask, placed were 1005 g of xylene and 5000 g of water. To the resulting mixture, was dropwise added a mixture of 2222 g of phenyl trichlorosilane (10.5 mols), 422 g of vinyl dimethyl chlorosilane (3.50 mols) and 1507 g of xylene, which was stirred further for 3 hours. The formed acid was separated, and the resulting mixture was washed with water. The remaining mixture was subjected to azeotropic dehydration. Then, 6 g of KOH (0.15 mols) was added to the resulting mixture and heated at 150 degrees C. to reflux through the night. Then, the reaction mixture was neutralized with 27 g of trimethylchlorosilane (0.25 mols) and 24.5 g of potassium acetate (0.25 mols), filtered and, subsequently, subjected to stripping under reduced pressure to remove the solvent to obtain the siloxane resin (Resin 2) represented by the following average formula. The equivalent of a vinyl group is 0.170 mol/100 g.

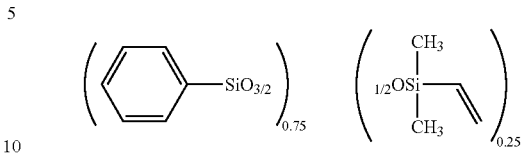

Synthesis Example 3

In a flask, placed were 1000 g of xylene and 5014 g of water. To the resulting mixture, was dropwise added a mixture of 2285 g of phenyl trichlorosilane (10.8 mols), 326 g of vinyl dimethyl chlorosilane (2.70 mols) and 1478 g of xylene, which was stirred further for 3 hours. The formed acid was separated, and the resulting mixture was washed with water. The remaining mixture was subjected to azeotropic dehydration. Then, 6 g of KOH (0.15 mols) was added to the resulting mixture and heated at 150 degrees C. to reflux through the night. Then, the reaction mixture was neutralized with 27 g of trimethylchlorosilane (0.25 mols) and 24.5 g of potassium acetate (0.25 mols), filtered and, subsequently, subjected to stripping under reduced pressure to remove the solvent to obtain the siloxane resin (Resin 3) represented by the following average formula. The equivalent of a vinyl group is 0.131 mol/100 g.

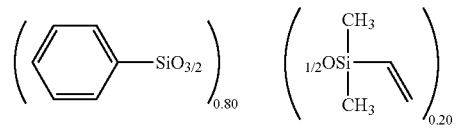

(B) Preparation of a Linear Organohydrogenpolysiloxane

Synthesis Example 4

In a flask, placed were 5376 g of diphenyldimethoxysilane (22.0 mols) and 151.8 g of acetonitrile, cooled 10 degrees C. and subjected to the following reaction at a reaction temperature below 10 degrees C. To the aforesaid resulting mixture, 303.69 g of strong sulfuric acid were dropwise added and, subsequently, 940.36 g of water were dropwise added for one hour to which 2216 g of $(HSiMe_2)_2O$ (16.5 mols) were dropwise added, and stirred through the night. Then, the formed acid was separated, and the remaining mixture was washed with water, and subjected to stripping under reduced pressure to obtain a linear organohydrogenpolysiloxane 1. The amount of the produced hydrogen gas was 90.32 ml/g, with the SiH equivalent of 0.403 mol/100 g. The organohydrogenpolysiloxane 1 thus obtained comprises 94.5 mass % of a linear organohydrogenpolysiloxane (B-1) having hydrosilyl groups at the both terminals and 5.5 mass % of another linear organohydrogenpolysiloxane (B-2) having a hydrosilyl group at one terminal, as determined by gas chromatography (GC). The GC chart is shown in FIG. 1.

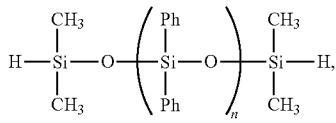
(B-1)

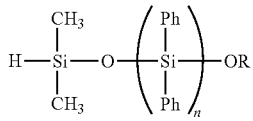
(B-2)

wherein average of n was 2.0 and R is a methyl group.

The determination by the gas chromatography was conducted with the following apparatus under the following conditions.

Apparatus:
GC-2014, ex Shimadzu Corporation
Conditions:
Carrier gas: helium,
Injection volume: 20 μl,
Temperature of a column: 50 degrees C.,
Temperature of a detector: 300 degrees C.,
Rate of temperature increase: 5 degrees C./min.,
Holding time: 60 min.

Examples 1 to 3

The components prepared in Synthesis Examples 1 to 4 and the following components were mixed in the amounts shown in the following Table 1 to prepare silicone resin compositions.

(A) Methyl vinyl phenyl polysiloxane represented by the following formula with a vinyl equivalent of 0.0185 mol/100 g and a molecular weight of 11000.

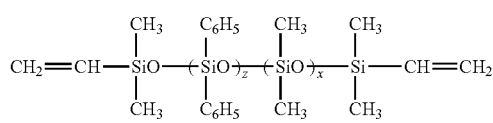

wherein, z is 30 and x is 68.

(C) Branched organohydrogenpolysiloxane represented by the following formula with the amount of produced hydrogen gas of 170.24 ml/g, SiH equivalent of 0.76 mol/100 g.

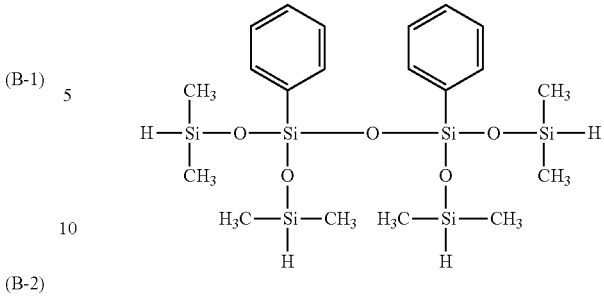

(D) Addition reaction catalyst: Octyl alcohol solution of chloroplatinic acid containing 2 mass % of platinum.

(E) Condensation catalyst: Orgatics ZA-65, 87% solution of tetra-n-butoxy zirconium in n-butanol, ex Matsumoto Trading Co., Ltd.

(F) Adhesion-imparting agent:

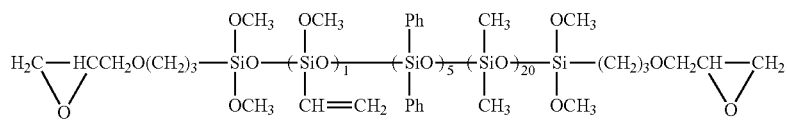

Comparative Examples 1 and 2

The same components were used as in the Examples 1 and 3, respectively, in the amounts shown in Table 1 to prepare silicone resin compositions, except that the following organohydrogenpolysiloxane (B') was used in place of the aforesaid linear organohydrogenpolysiloxane (B) were mixed.

(B') Organohydrogenpolysiloxane with the amount of produced hydrogen gas of 92.16 ml/g, SiH equivalent of 0.411 mol/100 g.

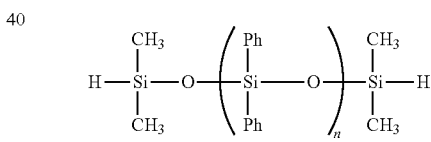

wherein, the average of n is 2.0.

The silicone resin compositions prepared in Examples 1 to 3 and Comparative Examples 1 and 2 were heated and molded at 150 degrees C. for 4 hours to form a cured product with a length of 110 mm, a width of 120 mm, and a thickness of 2 mm. Appearance of the cured products was observed by the naked eyes. The tensile strength, hardness and tensile elongation of the cured product were determined according to JIS K 6301. The hardness was measured with a type A spring test instrument. Further, the moisture permeability was determined according to JIS K 7129 by the Lyssy testing method with L80-5000, ex Lyssy company. The results are as shown in Table 1.

Adhesion Strength

The silicone resin compositions prepared in Examples 1 to 3 and Comparative Examples 1 and 2 were applied as a thin film on a silver plated copper substrate, five silicon chips having 5 mm on a side were placed on each of the compositions, and the compositions were cured at 60 degrees C. for one hour, and subsequently, at 150 degrees C. for 4 hours to prepare adhesion test pieces. The adhesion strength of the test pieces was determined with a die bond tester, Dage Series 4000 Bond tester, with a test speed of 200 μm/s, a test height of 10.0 μm, and a measurement temperature of 25 degrees C., and the mode of destruction was observed with a microscope. The results are as shown in Table 1.

pieces which showed cracks or peeling on interface of the package and the extense of discoloration around the silver plated surface in the package were observed with the naked eyes.

TABLE 1

| | | | Example 1 | Example 2 | Example 3 | Comparative Example 1 | Comparative Example 2 |
|---|---|---|---|---|---|---|---|
| | Molar ratio, Si—H/Si—Vi | | | | 1.1 | | |
| | Amount of the phenyl group | mass % | 44.7 | 47.3 | 46.6 | 45.8 | 47.5 |
| (A) | Resin 1 | parts by mass | 53 | | | 54.7 | |
| | Resin 2 | parts by mass | | 58.2 | | | |
| | Resin 3 | parts by mass | | | 62.5 | | 63.5 |
| | Methylvinylphenylpolysiloxane | parts by mass | 20.8 | 18.9 | 18.8 | 20.8 | 18.9 |
| (B) | Liner organohydrogenpolysiloxane | parts by mass | 16.5 | 16 | 11.4 | | |
| (C) | Branched organohydrogenpolysiloxane | parts by mass | 6.5 | 6.9 | 6 | 7.3 | 6.1 |
| (B') | Organohydrogenpolysiloxane | parts by mass | | | | 17.2 | 12.1 |
| (D) | Additional reaction catalyst | parts by mass | 0.02 | 0.02 | 0.02 | 0.02 | 0.02 |
| (E) | Condensation catalyst | parts by mass | 0.03 | 0.03 | 0.03 | 0.03 | 0.03 |
| (F) | Adhesion-imparting agent | parts by mass | 4 | 4 | 4 | 4 | 4 |
| Property of the cured product | Appearance | | Clear and colorless | Clear and colorless | Clear and colorless | Clear and colorless | Clear and colorless |
| | Hardness | Type A | 87 | 89 | 92 | 83 | 89 |
| | | Type D | 25 | 32 | 43 | 22 | 40 |
| | Tensile strength | MPa | 2.5 | 1.9 | 1.7 | 1.9 | 1.1 |
| | Tensile elongation | % | 80 | 65 | 40 | 65 | 25 |
| | Moisture permeability | g/m$^2$*day | 15 | 14 | 14 | 18 | 16 |
| | Adhesion test | Adhesion Strength, 5 mm × 5 mm, Kg/cm$^2$, | 78 | 75 | 70 | 59 | 44 |
| | | Mode of destruction | All cohesion failure. | All cohesion failure. | All cohesion failure. | 2/5 with interfacial peeling | 3/5 with interfacial peeling |
| | Sulfuration test, 150° C./1000 hr | Appearance | Clear and colorless | Clear and colorless | Clear and colorless | Clear and colorless | Clear and colorless |
| | Heat cycle test −40-100° C./200 cycle | Destructed piece | 0/5 | 0/5 | 0/5 | 2/5, peeled. | 2/5, peeled. |
| | | Appearance | Clear and colorless | Clear and colorless | Clear and colorless | Clear and colorless | Clear and colorless |
| | Lighting test under high temperature and high humidity 60° C./90 RH % 500 hr | Destructed piece | 0/5 | 0/5 | 0/5 | 2/5, peeled. | 2/5, peeled. |
| | | Appearance | Clear and colorless | Clear and colorless | Clear and colorless | Clear and colorless | Clear and colorless |

Preparation of an Optical Semiconductor Device

A cupped pre-molded package for an LED which had dimensions of 3 mm×3 mm×1 mm and an opening having a diameter of 2.6 mm and was equipped on the bottom surface with a copper lead frame plated with silver of a thickness of 2 μm, were treated with argon plasma at 100 W for 10 seconds of the exposure time. An electrode of InGaN type blue light-emitting device was connected to the lead frame presented on the bottom with a silver past, namely, conductive adhesive. A counter electrode of the light emitting device was connected to a counter lead frame with a gold wire and, then, each of the silicone resin compositions prepared in Examples 1 to 3 and Comparative Examples 1 and 2 was applied to the opening of the package, and cured at 60 degrees C. for one hour and subsequently, at 150 degrees C. for 4 hours to prepare optical semiconductor devices.

While an electrical current of 25 mA was applied to the aforesaid optical semiconductor devices to light on, the devices were placed in a hydrogen sulfide gas atmosphere at 150 degrees C. for 1000 hours. Then, the extense of discoloration around the silver plated surface of the package was observed with the naked eyes. Further, the optical semiconductor devices prepared were subjected to a heat cycle test and a lighting test in high temperature and high humidity conditions as shown in Table 1, and the number of the test In the Table 1, the mass % of the phenyl group is a percentage of the total amount of phenyl groups contained in the components (A), (B) and (C), based on the total amount of the components (A), (B) and (C).

As seen in Table 1, the cured products obtained by curing the present silicone resin compositions comprising the linear organohydrogenpolysiloxane having an alkoxy group or a hydroxyl group had very strong adhesion to a silver plated copper plate. The optical semiconductor devices encapsulated with the cured product did not cause peeling nor cracks in the heat cycle test and the lighting test under high temperature and high humidity. Further, the cured products had low gas permeability and did not cause discoloration in the sulfuration test. In contrast, the silicone resin compositions in Comparative Examples 1 and 2 comprising the organohydrogenpolysiloxane with no alkoxy group nor hydroxyl group showed lower adhesion to the substrate, and the optical semiconductor device encapsulated with the cured product obtained by curing the composition caused peeling and cracks in the heat cycle test and the lighting test under high temperature and high humidity.

INDUSTRIAL APPLICABILITY

The present silicone resin composition has very strong adhesion to a substrate, can provide a cured product having low gas permeability and provide an optical semiconductor device having high heat resistance, light resistance, discoloration resistance, impact resistance and reliability. Therefore, the present silicone composition can be advantageously used as an encapsulating material for optical semiconductor elements such as high brightness LEDs.

The invention claimed is:

1. A silicone resin composition comprising
   (A) 49 to 95 parts by mass of an organopolysiloxane having at least two alkenyl groups per molecule,
   (B) total 0.001 to 50 parts by mass of the following linear organohydrogenpolysiloxanes (B-1) and (B-2);
      (B-1) a linear organohydrogenpolysiloxane which has hydrogen atoms each bonded to a silicon atom at the both terminals, and
      (B-2) a linear organohydrogenpolysiloxane which has a single hydrogen atom bonded to a silicon atom at one terminal and a single hydroxyl or a single alkoxy group bonded to a silicon atom at the other terminal, provided that a mass ratio of the components (B-1) to (B-2) is (90 to 99.9):(10 to 0.1),
   (C) 0.01 to 20 parts by mass of a branched organohydrogenpolysiloxane having at least three hydrosilyl groups per molecule,
   provided that a total amount of components (A), (B) and (C) is 100 parts by mass,
   (D) a catalytic amount of an addition reaction catalyst, and
   (E) 0.001 to 1 part by mass of a condensation catalyst, relative to a total 100 parts by mass of components (A), (B) and (C).

2. The silicone resin composition according to claim 1, wherein the component (A) is represented by the following average compositional formula (1), $$R^1_a R^2_b R^3_c SiO_{(4-a-b-c)/2} \quad (1)$$

wherein $R^1$ is, independently of each other, a substituted or unsubstituted monovalent hydrocarbon group which does not have an alkenyl group and is not an aryl group, $R^2$ is an aryl group, $R^3$ is an alkenyl group, a is the number of 0.4 to 1.0, b is the number of 0 to 0.5, and c is the number of 0.05 to 0.5, provided that a+b+c is 1.0 to 2.0.

3. The silicone resin composition according to claim 1 or 2, wherein the component (B-1) is an organohydrogenpolysiloxane represented by the following formula (2);

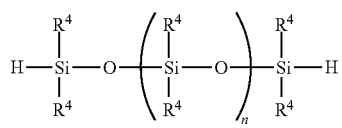
(2)

wherein $R^4$ is, independently of each other, a substituted or unsubstituted monovalent hydrocarbon group which does not have an alkenyl group and n is an integer of from 0 to 10, and the component (B-2) is an organohydrogenpolysiloxane represented by the following formula (3);

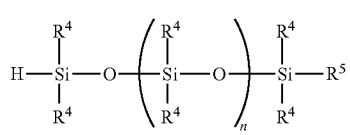
(3)

wherein $R^4$ is, independently of each other, a substituted or unsubstituted monovalent hydrocarbon group which does not have an alkenyl group, $R^5$ is a hydroxyl group or an alkoxy group, and n is an integer of from 0 to 10.

4. The silicone resin composition according to claim 3, wherein the component (B-1) is an organohydrogenpolysiloxane represented by the following formula (4);

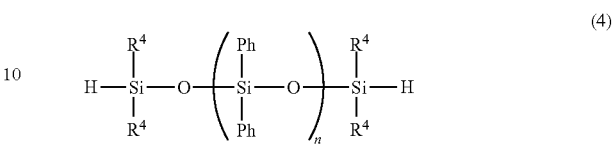
(4)

wherein $R^4$ is, independently of each other, a substituted or unsubstituted monovalent hydrocarbon group which does not have an alkenyl group, n is an integer of from 0 to 10, and Ph means a phenyl group, and
the component (B-2) is an organohydrogenpolysiloxane represented by the following formula (5);

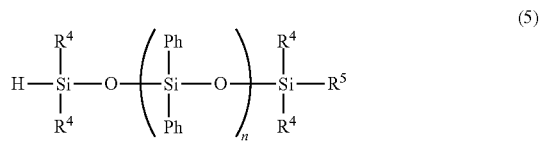
(5)

wherein $R^4$ is, independently of each other, a substituted or unsubstituted monovalent hydrocarbon group which does not have an alkenyl group, $R^5$ is a hydroxyl group or an alkoxy group, n is an integer of from 0 to 10, and Ph means a phenyl group.

5. The silicone resin composition according to claim 1, wherein the component (C) is represented by the following average compositional formula (6), $$R^7_a R^2_b H_d SiO_{(4-a-b-d)/2} \quad (6)$$

wherein $R^7$ is, independently of each other, a substituted or unsubstituted monovalent hydrocarbon group which does not have an alkenyl group and is not an aryl group, $R^2$ is an aryl group, a is the number of 0.6 to 1.5, b is the number of 0 to 0.5, and d is the number of 0.4 to 1.0, provided that a+b+d is 1.0 to 2.5.

6. The silicone resin composition according to claim 1, wherein the composition comprises the aryl group of 10 to 60 mass % based on the total amount of components (A), (B) and (C).

7. The silicone resin composition according to claim 1, wherein the total amount of the hydrosilyl group in components (B) and (C) is 0.5 to 4.0 equivalents per equivalent of the alkenyl group of component (A).

8. The silicone resin composition according to claim 1, wherein the silicone resin composition further comprises 0.001 to 10 parts by mass of an adhesion-imparting agent (F), relative to the total 100 parts by mass of components (A), (B) and (C).

9. The silicone resin composition according to claim 1, wherein the silicone resin composition further comprises 0.01 to 300 parts by mass of an inorganic filler (G), relative to the total 100 parts by mass of components (A), (B) and (C).

10. An optical semiconductor device provided with a cured product obtained by curing the silicone resin composition of claim 1.

* * * * *